US012685110B2

(12) United States Patent
van der Straten et al.

(10) Patent No.: US 12,685,110 B2
(45) Date of Patent: Jul. 14, 2026

(54) OCTAGONAL INTERCONNECT WIRING FOR ADVANCED LOGIC

(71) Applicant: International Business Machines Corporation, Armonk, NY (US)

(72) Inventors: Oscar van der Straten, Guilderland Center, NY (US); Scott A. DeVries, Albany, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 18/145,157

(22) Filed: Dec. 22, 2022

(65) Prior Publication Data

US 2024/0213092 A1     Jun. 27, 2024

(51) Int. Cl.
| | |
|---|---|
| *H10W 20/00* | (2026.01) |
| *H10P 50/00* | (2026.01) |
| *H10W 20/41* | (2026.01) |

(52) U.S. Cl.
CPC .......... *H10W 20/057* (2026.01); *H10P 50/73* (2026.01); *H10W 20/033* (2026.01); *H10W 20/076* (2026.01); *H10W 20/425* (2026.01); *H10W 20/435* (2026.01)

(58) Field of Classification Search
CPC .......... H01L 23/5283; H01L 23/53266; H01L 21/76879; H01L 21/76831; H01L 21/76843; H10W 20/057; H10W 20/425; H10W 20/033; H10W 20/076; H10W 20/435; H10W 20/40; H10P 50/73
See application file for complete search history.

(56) References Cited

U.S. PATENT DOCUMENTS

| | | | | |
|---|---|---|---|---|
| 3,648,131 | A | 3/1972 | Stuby | |
| 6,645,853 | B1 * | 11/2003 | Ngo | H01L 23/53238 |
| | | | | 257/E23.145 |
| 6,660,630 | B1 | 12/2003 | Chang | |
| 7,354,856 | B2 | 4/2008 | Yeh | |
| 7,863,185 | B2 | 1/2011 | Oh | |
| 9,379,042 | B2 * | 6/2016 | Park | H10B 12/485 |
| 9,418,889 | B2 | 8/2016 | Mountsier | |
| 9,613,853 | B2 | 4/2017 | Chen | |
| 10,224,312 | B1 * | 3/2019 | Jones | H01L 24/08 |
| 10,886,195 | B2 | 1/2021 | Ingerly | |
| 11,127,711 | B2 * | 9/2021 | Shini | H01L 24/94 |

(Continued)

*Primary Examiner* — John M Parker
(74) *Attorney, Agent, or Firm* — Michael O'Keefe

(57) ABSTRACT

A chip is manufactured using a method for forming a back-end-of-line (BEOL) layer on an IC chip surface comprises providing a first layer on top of a substrate layer of the IC chip, the first layer comprising a bottom portion of a metallic fill region having a first width as seen in a vertical cross-section of the IC chip. The method further provides a second layer on top of the first layer. The second layer comprises a middle portion of the metallic fill region having a second width that is wider than the bottom portion of the metallic fill region. The method provides a third layer on top of the second layer. The third layer comprises a top portion of the metallic fill region having a third width as seen in the vertical cross-section of the IC chip that is narrower than middle portion of the metallic fill region.

11 Claims, 11 Drawing Sheets

(56) References Cited

U.S. PATENT DOCUMENTS

| | | | |
|---|---|---|---|
| 2002/0000665 A1* | 1/2002 | Barr | H01L 21/76843 |
| | | | 257/E21.585 |
| 2004/0152294 A1* | 8/2004 | Choi | H01L 21/76804 |
| | | | 438/622 |
| 2013/0280879 A1* | 10/2013 | Stecher | H01L 21/31144 |
| | | | 257/E21.022 |
| 2020/0035630 A1* | 1/2020 | Kameshima | H01L 23/5226 |
| 2021/0118796 A1* | 4/2021 | Breuer | H01L 21/76877 |
| 2022/0157956 A1 | 5/2022 | Chen | |
| 2023/0275024 A1* | 8/2023 | Chin | H01L 23/585 |
| 2024/0145378 A1* | 5/2024 | Liu | H01L 23/585 |

* cited by examiner 100 (405)

100 (410)

100 (415)

100 (450)

156

150
130
110
142

100 (455)

140.2
150
130
110

142.3
142.2
142.1

100 (470)

100 (475)

OCTAGONAL INTERCONNECT WIRING FOR ADVANCED LOGIC

BACKGROUND

The manufacture of semiconductor chips has advanced significantly in recent years. As features on these chips have become smaller and smaller, the need for precision and repeatability in their manufacture becomes ever more critical.

One component in semiconductor chips is the interconnect wiring. Interconnect wiring is a substantial component on any integrated circuit that is manufactured. As component features get smaller and smaller, controlling variability becomes more important. The use of various metal filling techniques can impact the critical dimensions (CDs) of this wiring. For purposes of discussion herein, an integrated circuit (IC) chip may be thought of as having three primary layers: at the bottom is a front-end-of-line (FEOL) layer which contains individual components of the IC; in the middle is a back-end-of-line (BEOL) layer where the individual components are interconnected to one another—it includes insulating levels and layers, metal levels and layers and regions interspersed within insulating materials, and bonding sites for chip-to-package connectors; and on top is the back-end packaging layer.

One problem is that, for the BEOL layer in which a pitch of interconnects below 30 nm, resistance/capacitance (R/C) delay is growing unsustainably large and there is a need to fill minimum CD interconnect lines with non-Cu metallization (e.g., Ru) for lower line R. However, dielectric line wiggling caused by alternative metal stress (e.g., Ru) is a big concern—this concern is more obvious in case of higher trench aspect ratio.

FIG. 1 is a cross-section view of an IC chip 100 that illustrates a known metal filling technique for interconnect wiring. The IC chip 100 is formed of a substrate layer 110 (which constitutes the FEOL layer described above) and a second layer(s) 115 (which constitutes the BEOL layer described above) above the substrate layer 110 into which the interconnect wiring structures (IWSs) 116A, 116B are formed. FIG. 1A shows the type of line wiggling that may occur that results in line CD variability, based on manufacturing variability. As can be seen in FIG. 1A, a first IWS 116A does not extend all the way to the substrate 110, resulting in both a shorter top width 117A and shorter height 119A that an adjacent second IWS 116B, having a longer top width 117B and taller height 119B.

What is needed to help resolve this problem is a mechanism that helps to reduce this line wiggling that results in the IC chip interconnect line CD variability.

SUMMARY

Various embodiments of an IC chip comprise a substrate and a back-end-of-line (BEOL) layer on top of the substrate. The BEOL comprises an octagonal metal fill region having an octagonal cross-sectional shape that is bounded on its sides by dielectric material. Advantageously, this helps to minimize dielectric line wiggling and better maintain critical dimensions of lines.

In some embodiments, the octagonal metal fill region comprises a same material. Advantageously, this may simplify processing operations.

In some embodiments, a lower sidewall of the octagonal metal fill region has an angle between 120° and 150° with a horizontal planar layer of the IC chip, an upper sidewall of the octagonal metal fill region has an angle between 30° and 60° with a horizontal planar layer of the IC chip, and a middle sidewall of the octagonal metal fill region has an angle of 90° with a horizontal planar layer of the IC chip. Advantageously, use of these dimensions helps to maintain a low aspect ratio of the features during the manufacturing process.

In some embodiments, a metal liner separates the metal fill region from the dielectric material, which may comprise at least one material selected from the group consisting of TaN, WN, and MoN. The metal liner may comprise a lower component separating a metal fill region lower portion from the dielectric material, a middle component separating a metal fill region middle portion from the dielectric material, and an upper component separating a metal fill region upper portion from the dielectric material, and the lower component, the middle component, and the upper component comprise materials that are different from one another. These materials may be at least two materials selected from the group consisting of TaN, WN, and MoN. Advantageously, this structure provides flexibility in the construction of the IC chip.

In some embodiments, the dielectric material is selected from the group consisting of an organic polymer low-k dielectric and an SiCO-based low-k dielectric. The organic polymer low-k dielectric may be parylene, and the SiCO-based low-k dielectric may be selected from the group consisting of SiCOH and SiCNOH. Advantageously, use of these dielectric materials may help to optimize operation of the fully assembled IC chip.

In some embodiments, the metal fill region comprises a metal selected from the group consisting of Ru, Pt, W, Co, Mo, Ni, and Rh. Advantageously, use of these metal fill region materials may help to optimize operation of the fully assembled IC chip.

Various embodiments of an IC chip comprise a substrate and a back-end-of-line (BEOL) layer on top of the substrate. The BEOL comprises, in vertical cross section, a metal fill region surrounded by a dielectric material and comprising a middle section with a critical dimension that is wider horizontally than an upper and a lower section of the metal fill region. Advantageously, this helps to minimize dielectric line wiggling and better maintain critical dimensions of lines.

Various embodiments of a method for forming a back-end-of-line (BEOL) layer on an IC chip surface comprise providing a first layer on top of a substrate layer of the IC chip, the first layer comprising a bottom portion of a metallic fill region having a first width as seen in a vertical cross-section of the IC chip. The bottom portion of the metallic fill region is located between portions of a bottom dielectric layer. The method further provides a second layer on top of the first layer. The second layer comprises a middle portion of the metallic fill region having a second width as seen in the vertical cross-section of the IC chip that is wider than the bottom portion of the metallic fill region. The middle portion of the metallic fill region is located between portions of a middle dielectric layer. The method provides a third layer on top of the second layer. The third layer comprises a top portion of the metallic fill region having a third width as seen in the vertical cross-section of the IC chip that is narrower than the middle portion of the metallic fill region. The top portion of the metallic fill region is located between portions of a top dielectric layer. Advantageously, this helps to minimize dielectric line wiggling and better maintain critical dimensions of lines.

In some embodiments, in cross-section, the bottom portion of the metallic fill region is formed as a first isosceles trapezoid comprising two parallel sides in a horizontal plane of layers of the IC chip, and a top side that is longer than a bottom side, the middle portion of the metallic fill region is formed as a rectangle, and the top portion of the metallic fill region is formed as a second isosceles trapezoid comprising two parallel sides in a horizontal plane of layers of the IC chip, and a top side that is shorter than a bottom side. Advantageously, this design allows the basic structure of the IC chip to be formed to minimize variation in the end IC chip design.

In some embodiments, the first layer is formed by providing a dielectric A layer above a substrate layer, applying a first hardmask on a top surface of the dielectric A layer, creating the first isosceles trapezoid by etching away portions of the dielectric A layer down to a top of the substrate creating a first etched region, removing the first hardmask, applying a first metal liner layer on top and side surfaces of the remaining dielectric A layer portions and exposed substrate region, applying a first metal fill layer within and above the etched portions of the dielectric A layer on top of the first metal liner layer, and planing the IC chip to a level of a top surface of the dielectric A layer, the second layer is formed by selectively depositing a dielectric B layer on top of the top layer of the dielectric A layer, applying a second metal liner layer on top and side surfaces of the selectively deposited dielectric B layer portions and top portions of the first metal fill layer, and applying a second metal fill layer between and above the portions of the dielectric B layer and between portions of the second metal liner layer, and the third layer is formed by applying a second hardmask on a top surface of the second metal fill layer, performing a tapered metal etching of the second metal fill layer down to a top surface of the dielectric B layer, removing the second hardmask, applying a third metal liner layer on a top layer of the dielectric B layer and exposed side and top surfaces of a third metal fill layer extending above the second metal fill layer, removing a portion of the third metal liner layer that extends above a top surface of the third metal fill layer, depositing a dielectric C layer on top of the top layer of the dielectric B layer, on the top surface of the third metal fill layer, and on sides of the third metal fill layer, and planing the IC chip to the top surface of the third metal fill layer. Advantageously, this allows the use of known IC chip manufacture techniques to be combined in a novel manner to produce the IC chip structure design that is described herein.

In some embodiments, the etching away of portions of the dielectric A layer is performed by an ion beam etching operation, the applying of the first metal liner layer is performed using an atomic layer deposition (ALD) process, the planing of the IC chip to a level of a top surface of the dielectric A layer is performed using a chemical mechanical planarization (CMP) operation, the performing of the tapered metal etching of the second metal fill layer is performed using an ion beam etching operation, the applying of the third metal liner layer is performed using an ALD operation, and the planing of the IC chip to the top surface of the third metal fill layer is performed using a CMP operation. Advantageously, these particular techniques are suited for an efficient manufacture of various chip layers.

In some embodiments, the dielectric A layer comprises an SiCO-based low-k dielectric, the first metal liner layer comprises WN, the first metal fill layer comprises a material selected from the group consisting of Ru, Pt, W, Co, Mo, Ni, and Rh, the dielectric B layer comprises an organic polymer low-k dielectric, the second metal liner layer comprises TaN, the third metal liner layer comprises MoN, and the dielectric C layer comprises an SiCO-based low-k dielectric or an organic polymer low-k dielectric. Advantageously, use of these dielectric materials may help to optimize operation of the fully assembled IC chip.

In some embodiments, the metal fill region comprises a metal selected from the group consisting of Ru, Pt, W, Co, Mo, Ni, and Rh. Advantageously, use of these metal fill region materials may help to optimize operation of the fully assembled IC chip.

BRIEF DESCRIPTION OF THE DRAWINGS

Various embodiments are described herein with reference to different subject-matter. In particular, some embodiments may be described with reference to methods, whereas other embodiments may be described with reference to apparatuses and systems. However, a person skilled in the art will gather from the above and the following description that, unless otherwise notified, in addition to any combination of features belonging to one type of subject-matter, also any combination between features relating to different subject-matter, in particular, between features of the methods, and features of the apparatuses and systems, are considered as to be disclosed within this document.

The aspects defined above, and further aspects disclosed herein, are apparent from the examples of one or more embodiments to be described hereinafter and are explained with reference to the examples of the one or more embodiments, but to which the invention is not limited. Various embodiments are described, by way of example only, and with reference to the following drawings.

DETAILED DESCRIPTION

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein has been chosen to best explain the principles of the embodiments, the practical application or technical improvement over technologies found in the marketplace, or to enable others of ordinary skill in the art to understand the embodiments disclosed herein.

Octagonal Interconnect Wiring for Advanced Logic

The following application-specific acronyms may be used below:

ALD atomic layer deposition
BEOL back-end-of-line
CD critical dimension
CMP chemical mechanical planarization CVD chemical vapor deposition
FEOL front-end-of-line
IC integrated circuit
IWS interconnect wiring structure
PECVD plasma-enhanced chemical vapor deposition Table 2

Application-Specific Acronyms

Figure 1:
FIG. 1 is a cross-section view of an IC chip that illustrates a known metal filling technique/structure for interconnect wiring.
Figure 1:
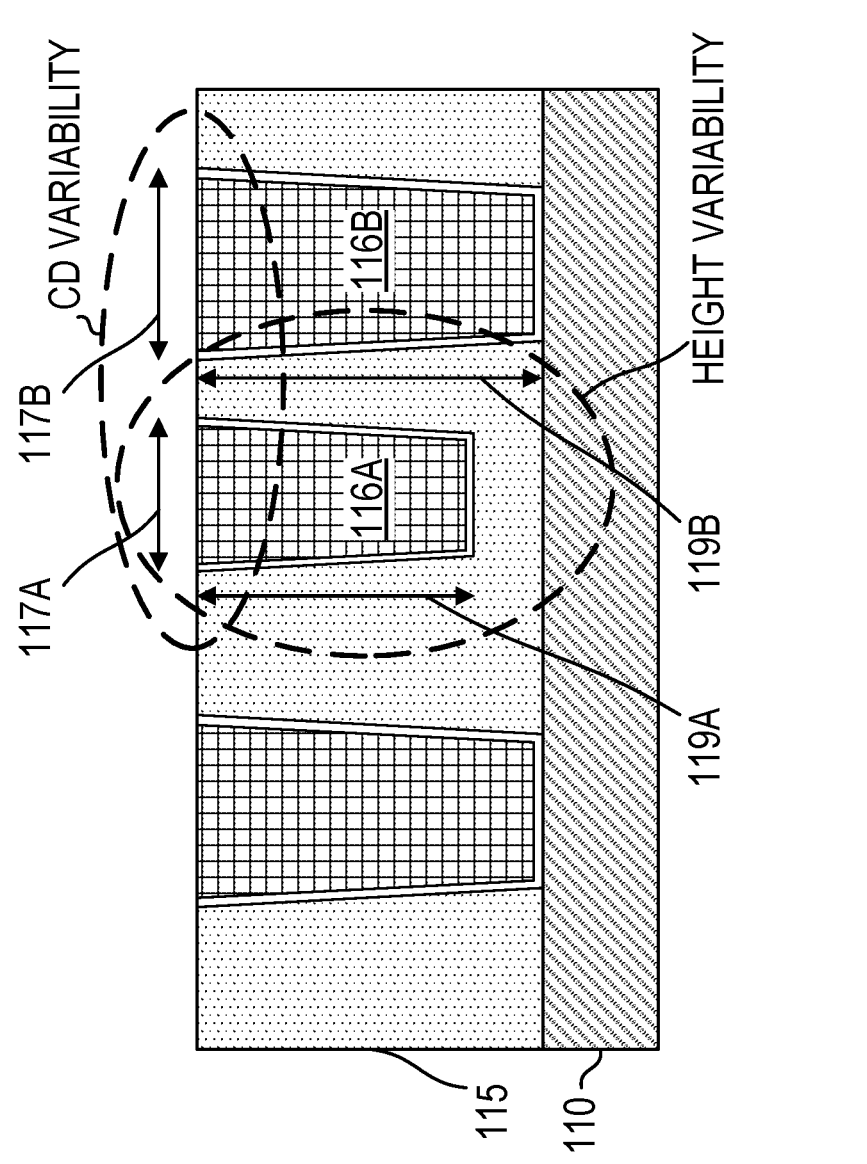
Figure 2:
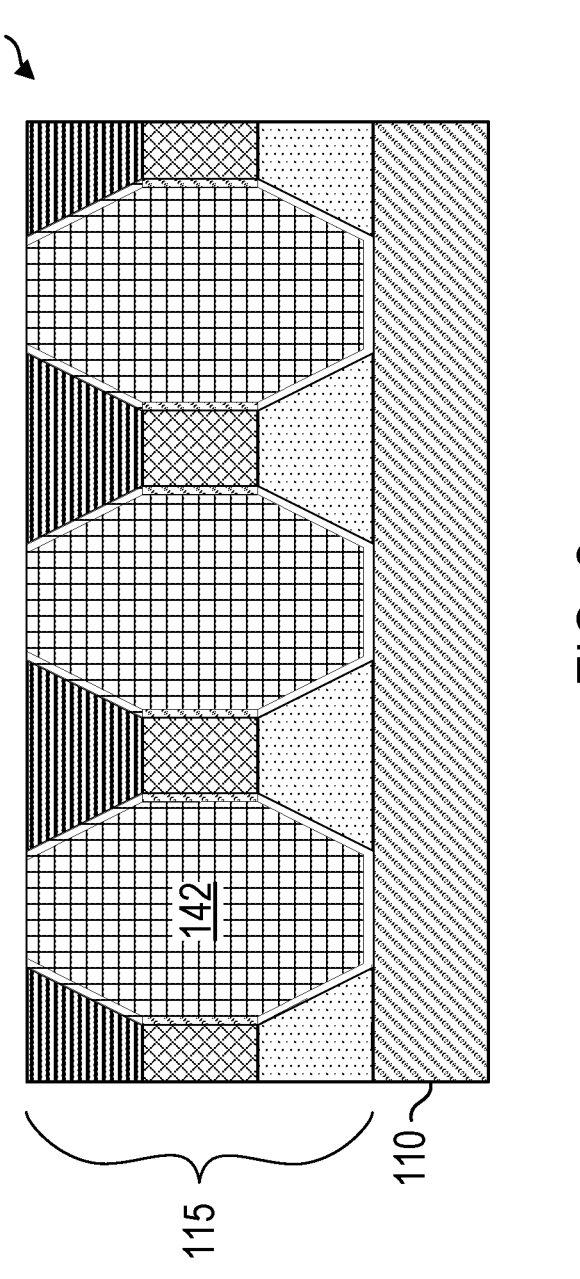
FIG. 2 is a cross-section view of an IC chip that illustrates a metal filling technique for interconnect wiring, according to various embodiments described herein.
Figures 3A, 3B, 3C:
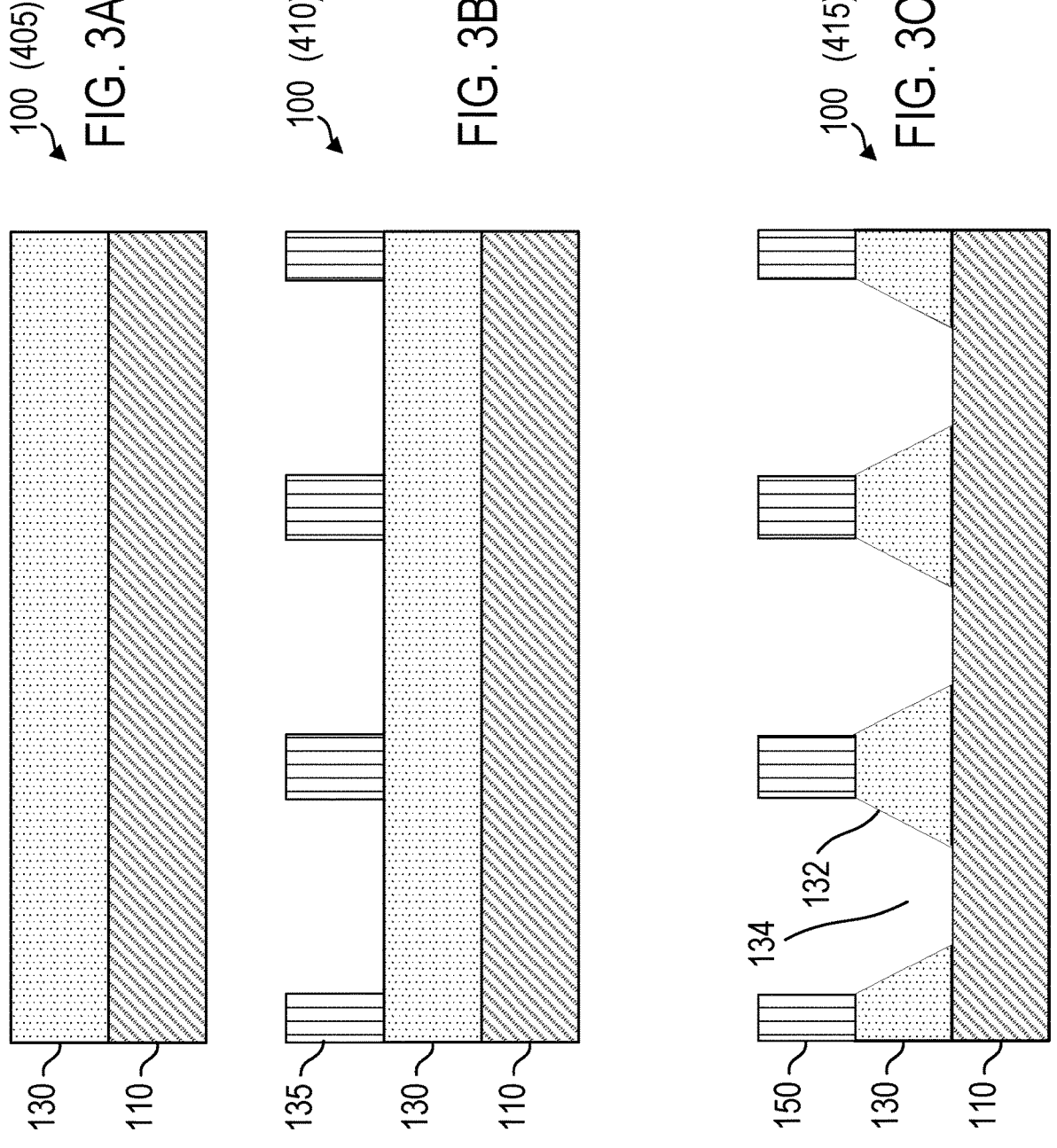
FIG. 3A-FIG. 3R are cross-sections of an IC chip shown at different stages of an example manufacturing process, according to various embodiments described herein.
Figures 3D, 3E, 3F:
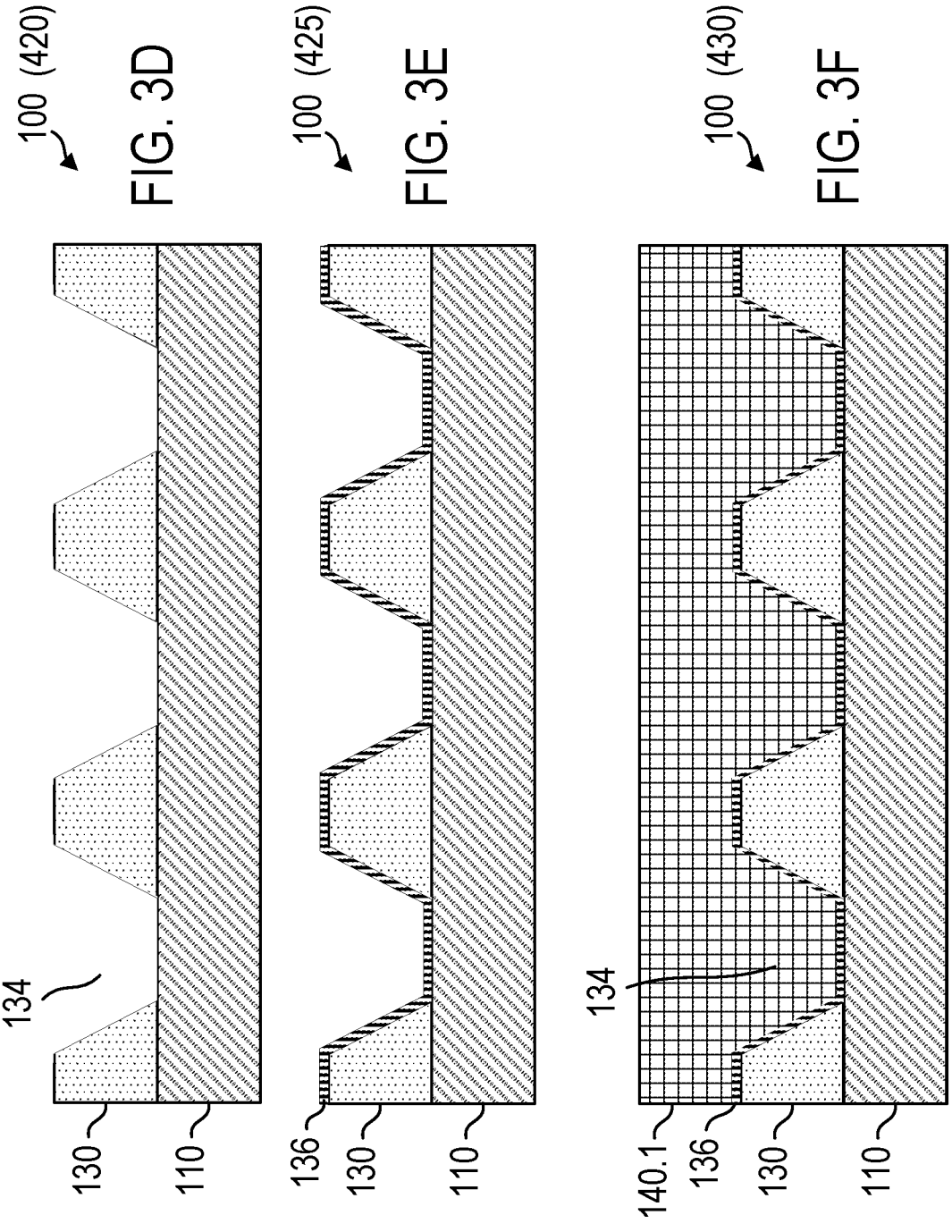
Figures 3G, 3H, 3I:
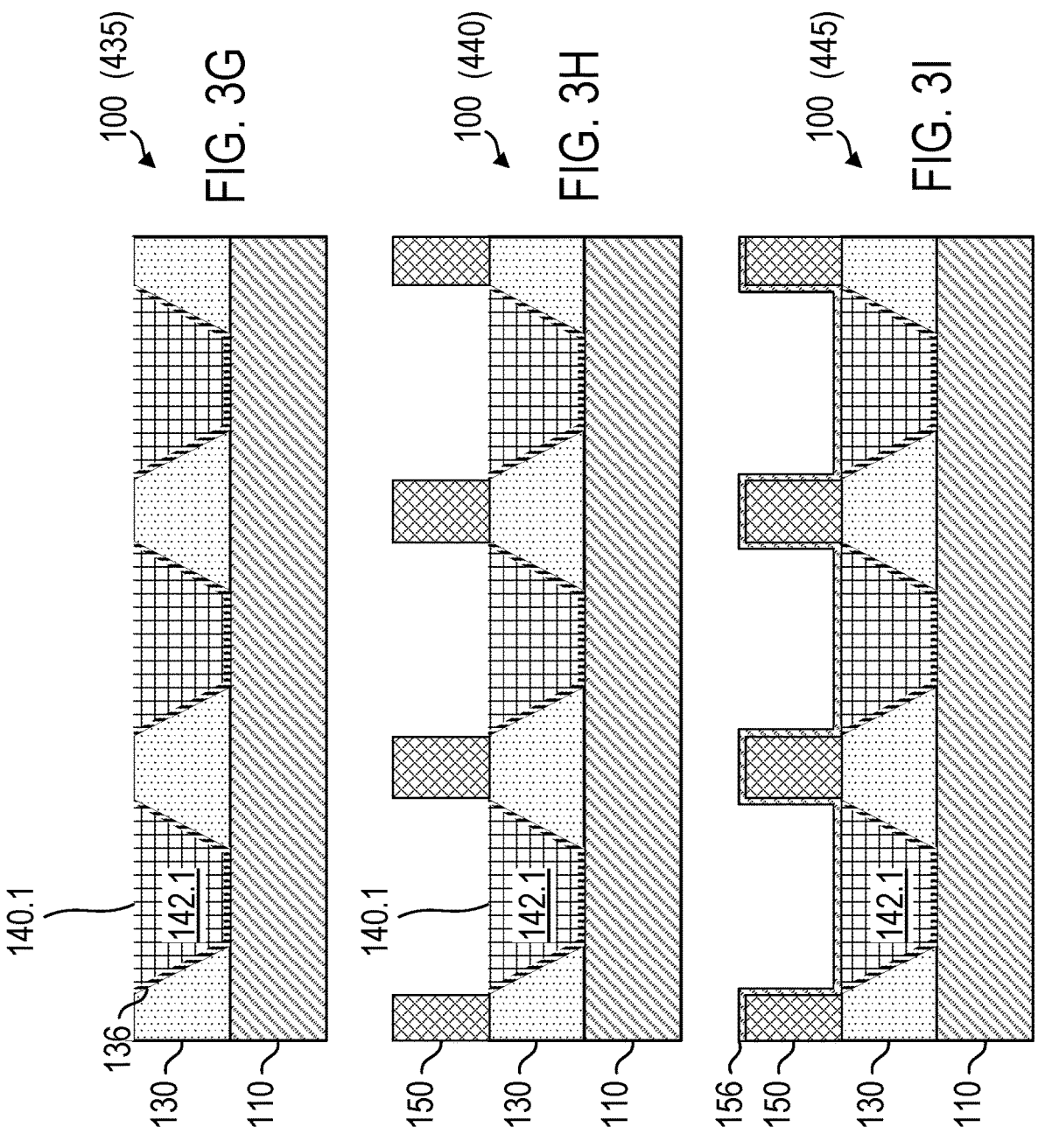
Figure 3J:
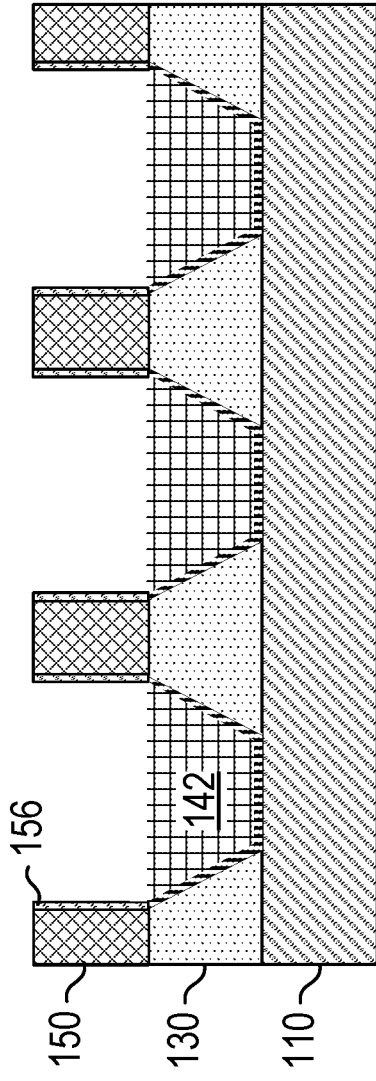
Figure 3K:
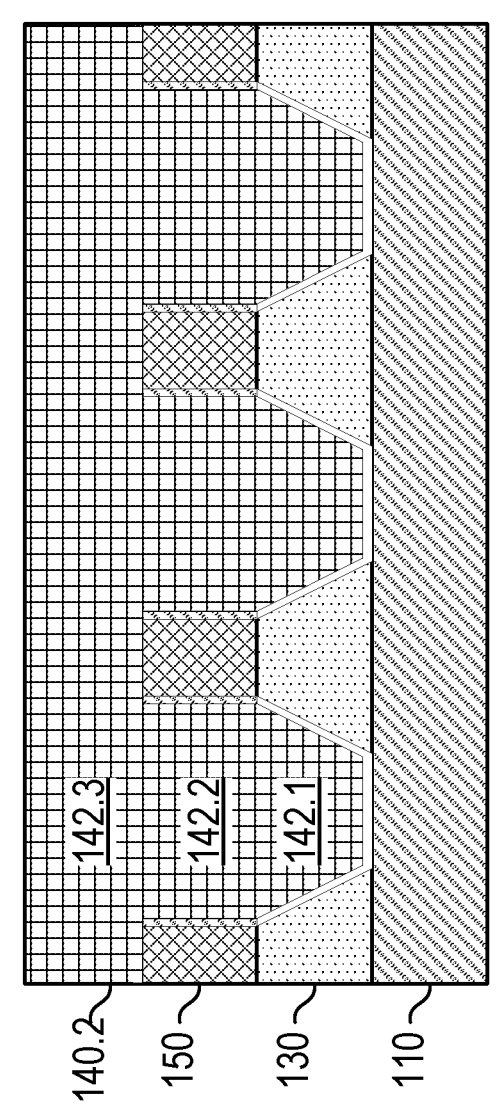
Figures 3L, 3M:
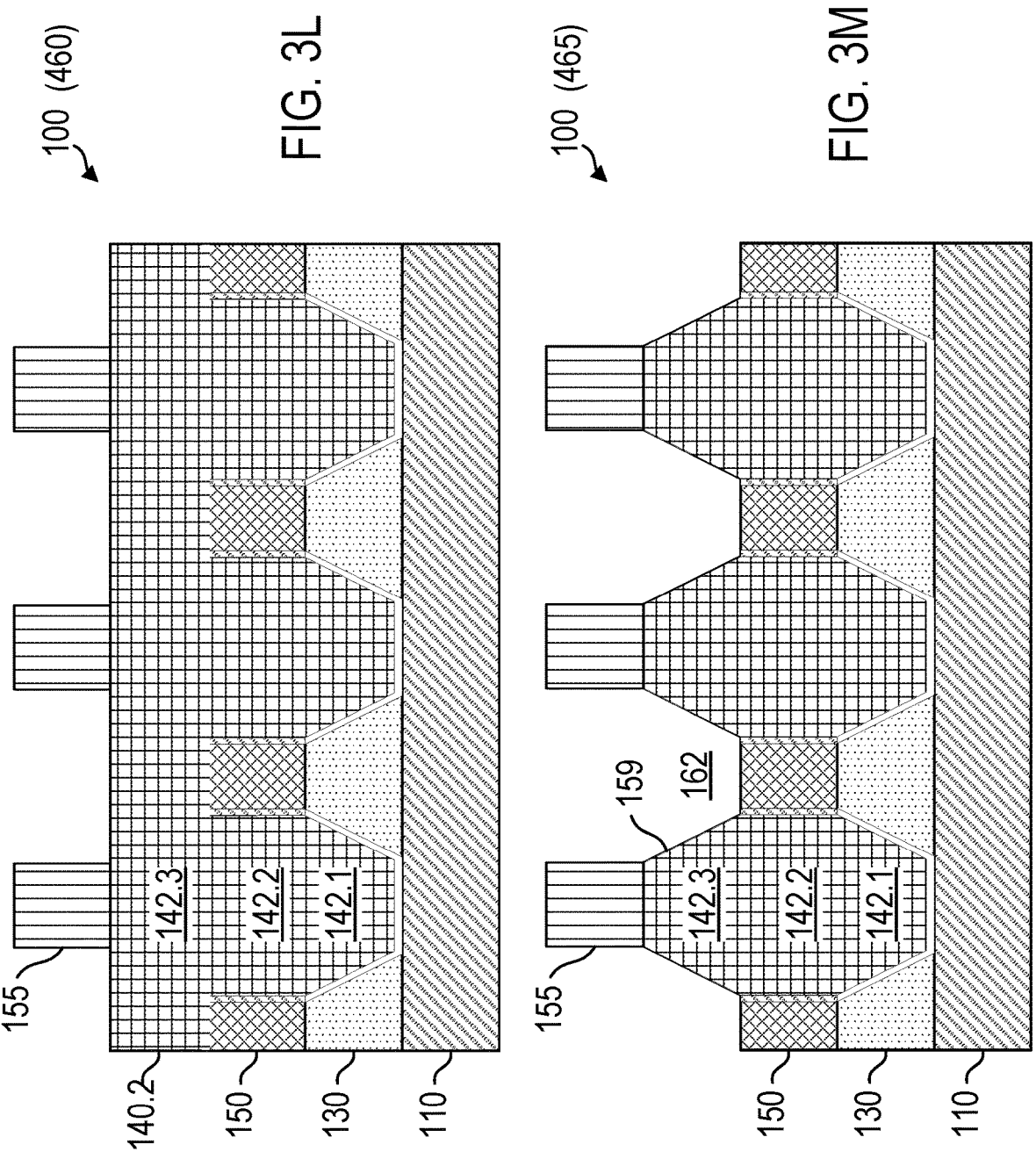
Figure 3N:
Figure 3N:
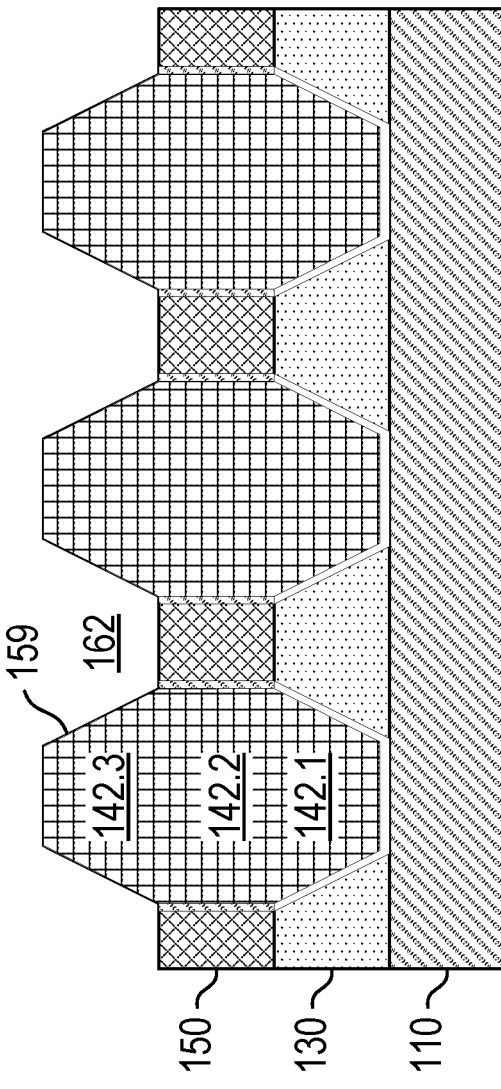
Figure 3O:
Figure 3O:
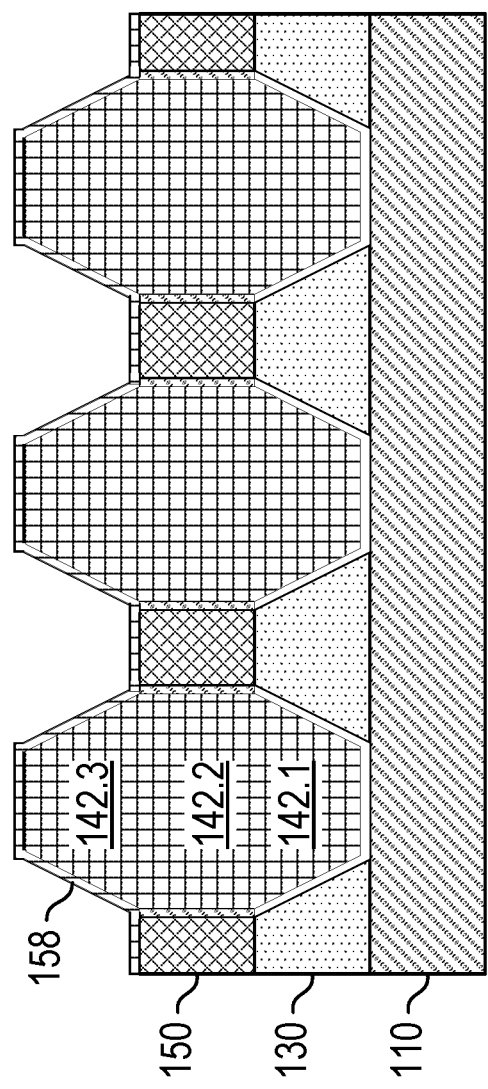
Figure 3P:
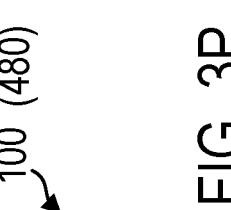
Figure 3P:
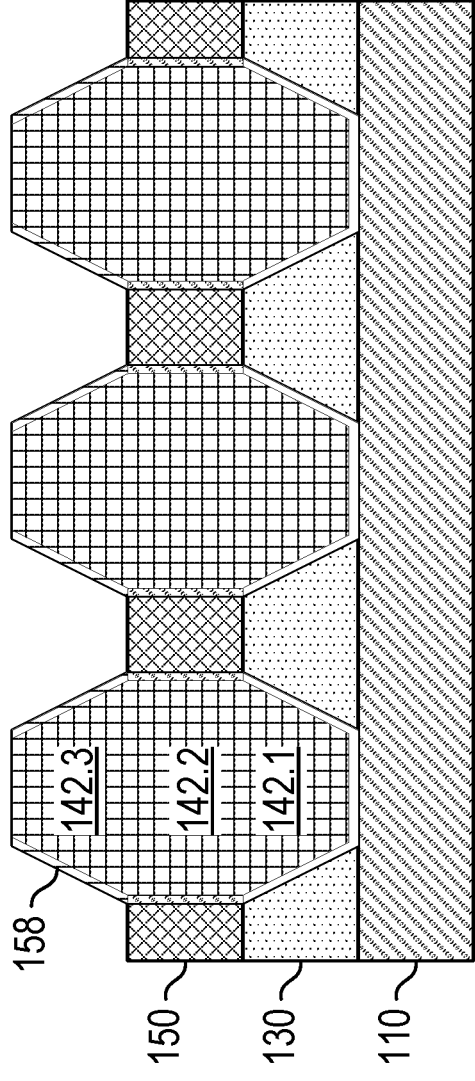
Figure 3Q:
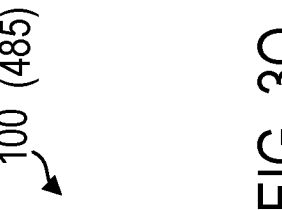
Figure 3Q:
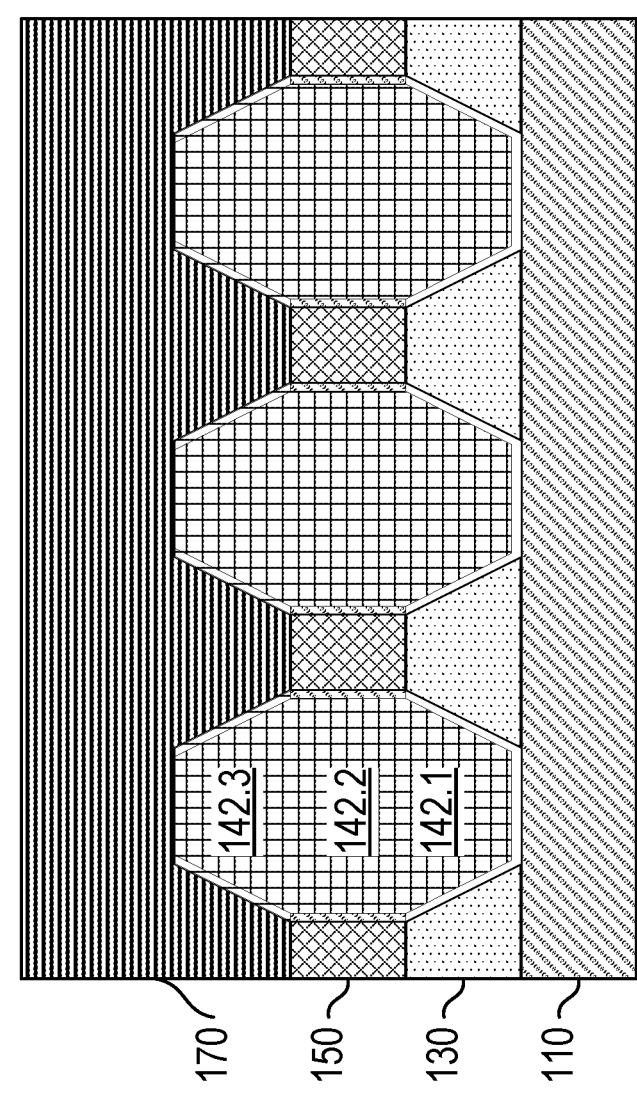
Figure 3R:
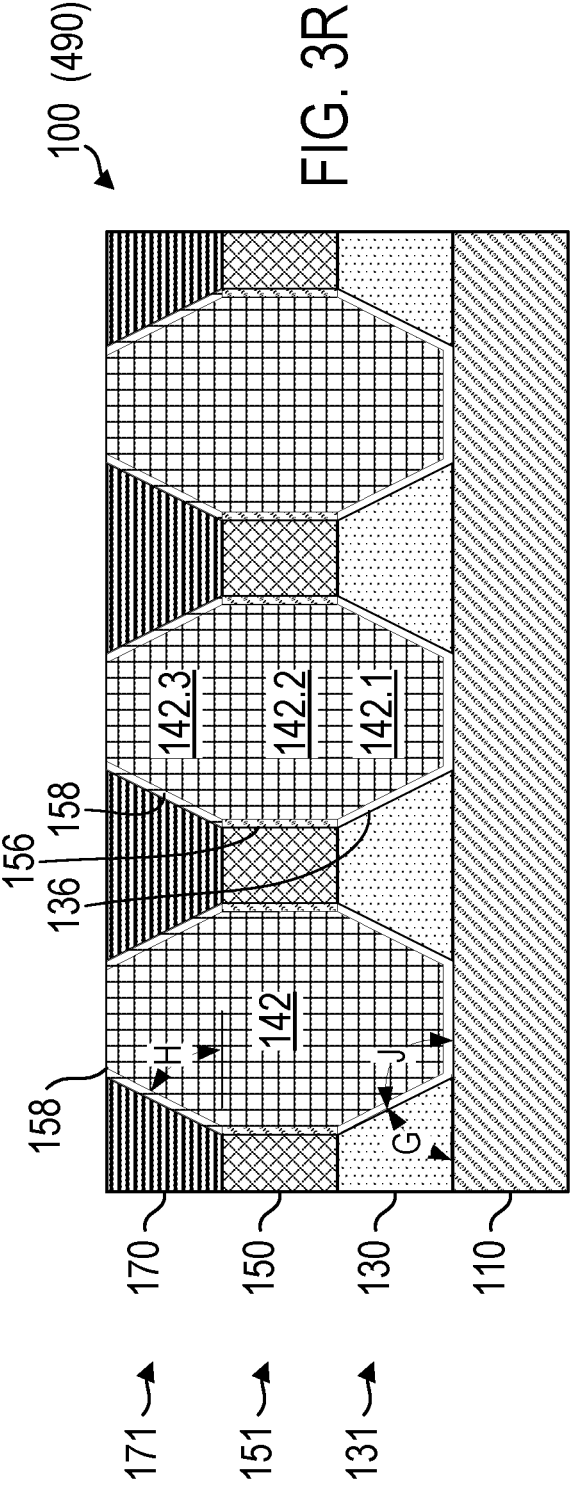

FIG. 2 is a cross-section view of an IC chip 100 that illustrates a metal filling technique for interconnect wiring according to various embodiments described herein, and is a simplified version of FIG. 3R. The IC chip 100 is formed of a substrate layer 110 (FEOL layer) and a second layer(s) 115 (BEOL layer), comprising a plurality of sublayers, described in more detail below, above the substrate layer 110 into which the interconnect wiring structures (IWSs) 142 are formed. These IWSs 142 comprise a lower portion, a middle portion, and an upper portion. The lower and upper portions are narrower in the vertical cross-section than the middle portion. In some embodiments, such a structure may form an octagonal shape. The portions are formed using low aspect ratio (height-to-width) dimensions, which helps to eliminate the variations described above with respect to the design shown in FIG. 1.

Figure 4:
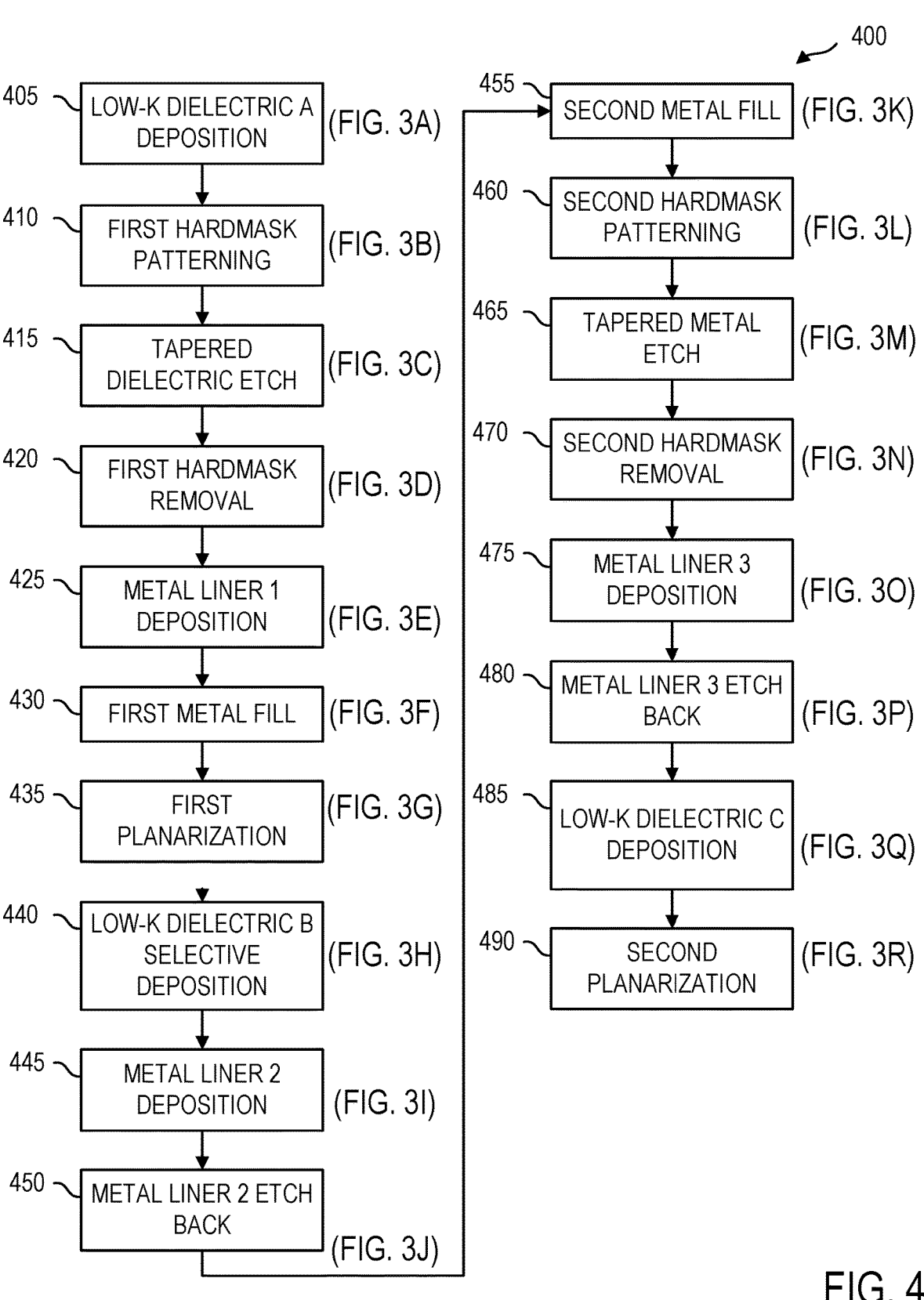
FIG. 4 is a flowchart illustrating operations of a manufacturing processes for manufacturing an IC chip, according to various embodiments described herein.

FIGS. 3A-3R are cross-sections of an IC chip 100 shown at different stages of an example manufacturing process 400 illustrated by way of example in FIG. 4. FIGS. 3A-3R and FIG. 4 are discussed in parallel below. FIG. 3R is a cross-section showing the final structural result of the process and illustrates the metallic octagonal region. The angled portion illustrating the octagon are labeled G, H, and J. Although many angles other than 90° may be used for G and H, various advantages may be achieved when G ranges between 30° and 60° (and thus J, within the metallic octagonal region, ranges between 150° and 120° respectively), and H ranges between 30° and 60°—use of these angles allows an advantageous use of layer staking having a low aspect ratio for line sections. The angle G represents the angle between a horizontal layer line and a lower sidewall of the octagonal region. The angle H represents the angle between a horizontal layer line and an upper sidewall of the octagonal region. The middle sidewall of the octagonal region is roughly 90°.

FIG. 3A shows a starting point after a low-k dielectric a deposition process 405 has been performed. Here, the substrate layer 110 (the FEOL layer) and a low-k dielectric A layer 130 are shown. In some embodiments, the low-k dielectric layer is an SiCO-based low-k dielectric. Further refinements on this embodiment may include SiCOH- and SiCNOH-based low-k dielectrics. The low-k dielectric layer A here, and the dielectric layers described below may be provided by chemical vapor deposition (CVD) or plasma-enhanced CVD (PECVD), for example. FIG. 3B shows a resultant structure of the IC 100 after a first hardmask patterning operation 410. The hardmask 135 is applied to the top of the dielectric A layer 130.

FIG. 3C shows a resultant structure of the IC 100 after a tapered dielectric etch operation 415. The tapered edges 132 of the etched regions 134 within the dielectric A layer 130 may be formed using, e.g., ion beam etching to achieve the desired taper. These etched regions 134 will ultimately form the base of the octagonal shape. FIG. 3D shows a resultant structure of the IC 100 after a hardmask removal operation 420, leaving the top surface of the resultant structure as the dielectric A layer 130. FIG. 3E shows a resultant structure of the IC 100 after a (first) metal liner one deposition operation 425, which covers the remaining dielectric A layer 130 and the exposed substrate 110 with a (first) thin metal liner one layer 136. This metallic layer 136 may be deposited using, e.g., an atomic layer deposition (ALD) of tungsten nitride (WN) process.

FIG. 3F shows a resultant structure of the IC 100 after a first metal fill operation 430. A first metal fill layer 140.1, which may be an Ru or W layer, or a material selected from the group consisting of Ru, Pt, W, Co, Mo, Ni, and Rh, is deposited on top of the thin metallic layer 136. Of significance, this first metal fill layer 140.1 is deposited such that it has a low aspect ratio, e.g., an aspect ratio of feature height over feature width of two, for a feature width below 20 nm. Use of the low aspect ratio here helps to address the line wiggling concern noted above as well as the metal gapfill concern because, e.g., the slanted walls are better able to receive the metal fill. Generally, lower aspect ratio features are easier to fill with metal, and lower aspect ratio features are less sensitive to distortion (wiggling) of the dielectric due to metal deposition induced stress.

The first metal fill layer 140.1 within the etched region 134 ultimately forms a bottom section of the octagonal shape. FIG. 3G shows a resultant structure of the IC 100 after a first chemical mechanical planarization (CMP) operation 435, which removes the first metal fill layer 140.1 portion and the thin metal line one layer 136 that extends above the top of the existing dielectric A layer 130, leaving a lower metal fill region 142.1 of the octagonal shape within the etched region 134. This lower region may have the cross-sectional shape of an isosceles trapezoid comprising two parallel sides in a horizontal plane of layers of the IC chip, and a top side that is longer than a bottom side.

FIG. 3H shows a resultant structure of the IC 100 after a low-k dielectric B selective deposition operation 440 in which the low-k dielectric B layer 150 is selectively applied to the exposed areas of the low-k dielectric A layer 130 using, e.g., for example, in some embodiments, an organic polymer low-k dielectric; one such embodiment may use parylene. FIG. 3I shows a resultant structure of the IC 100 after a (second) metal liner two deposition operation 445, which covers the top and sides of the dielectric B layer 150 and the top of the lower metal fill region 142.1 with a (second) thin metal liner layer two 156. This thin metal liner layer two 156 may be deposited using, e.g., an ALD of tantalum nitride (TaN) process.

FIG. 3J shows a resultant structure of the IC 100 after a metal liner two etch-back operation 450 in which the horizontal surfaces of the metal liner layer two 156 have been removed using an etch-back technique. FIG. 3K shows a resultant structure of the IC 100 after the addition of a second metal fill layer operation 455 in which a second metal fill layer 140.2 is added above the top of the dielectric B layer 150. The second metal fill layer 140.2 may be made of the same material as the first metal fill layer 140.1. Of significance, this second metal fill layer 140.2 is also deposited such that it has a low aspect ratio. Use of the low aspect ratio here further helps to address the line wiggling concern noted above as well as the metal gapfill concern. The second metal fill layer 140.2 lays the basis for a middle metal fill region 142.2, and a top metal fill region 142.3 that ultimately forms a mid section and a top section, respectively, of the octagonal shape. The middle metal fill region 142.2 May comprise a rectangular cross-sectional shape with bottom and top lines correspond to the bottom and top lines (horizontal surfaces in 3D) of the dielectric B layer 150. The top metal fill region 142.3 May have the cross-sectional shape of an isosceles trapezoid comprising two parallel sides in a horizontal plane of layers of the IC chip, and a top side that is shorter than a bottom side.

FIG. 3L shows a resultant structure of the IC 100 after a second hardmask patterning operation 460. The hardmask 155 is applied to the top of the second metal fill layer 140.2. FIG. 3M shows a resultant structure of the IC 100 after a tapered metal etch operation 465. The tapered edges 152 of the etched regions 162 within the top metal fill region 142.3 May be formed using, e.g., ion beam etching to achieve the desired tapered edges 159. These etched regions 162 separate the top portions of the octagonal structure. This octagonal structure 142.1, 142.2, 142.3 may be collectively represented by the reference character 142. Although some embodiments are described herein as having the octagonal structure 142 as being a common metallic material, it may be possible in some embodiments that all or some of the metal fill regions 142.1, 142.2, 142.3 are made of different metal materials.

FIG. 3N shows a resultant structure of the IC 100 after a second hardmask removal operation 470, that exposes a top surface of the octagonal structure 142. FIG. 3O shows a resultant structure of the IC 100 after a (third) metal liner three deposition operation 475, which covers the top of the dielectric B layer 150 and the top and sides of the top metal fill region 142.3 with a (third) thin metal liner layer three 158. This thin metal liner layer three 158 may be deposited using, e.g., an ALD of molybdenum nitride (MoN) process.

FIG. 3P shows a resultant structure of the IC 100 after a metal liner three etch-back operation 480 in which the horizontal surfaces of the metal liner layer three 158 have been removed using an etch-back technique. FIG. 3Q shows a resultant structure of the IC 100 after a low-k dielectric C deposition operation 485 in which the low-k dielectric C layer 170 is applied to the exposed areas of the low-k dielectric B layer 150, the sides of the thin metal liner layer three 158, and the top exposed surface of the top metal fill region 142.3.

FIG. 3R shows a resultant structure of the IC 100 after a second CMP operation 490, which removes the low-k dielectric C layer 170 portion that extends above the top of the existing metal fill region 142 to provide the final result. FIG. 3R shows the BEOL 131, 151, 171 made up of three different layers: a bottom BEOL layer 131, a middle BEOL layer 151, and a top BEOL layer 171, with each of these overall layers 131, 151, 171 comprising an insulator 130, 150, 170, a portion of the metal fill region 142.1, 142.2, 142.3 (142), and a metal liner 136, 156, 158 that separates the insulator from the metal fill region 142, respectively. As discussed above, the portions of the insulator on each respective overall layer may be made of all of the same, partially the same, or none of the same material. The portions of the metal liner on each respective overall layer may be made of all of the same, partially the same, or none of the same material. Finally, the portions of the metal fill region on each respective overall layer may be made of all of the same, partially the same, or none of the same material. The metal fill region 142 and any respective portions thereof 142.1, 142.2, 142.3 May contain one or more of the following metals, individually or in combination: Ru, Pt, W, Co, Mo, Ni, and Rh. The materials used in combination may be any of the materials for that particular feature (dielectric, metal fill region, and metal liner) discussed above.

EXAMPLES

The following illustrate various examples of embodiments described herein.

Example 1 is an IC chip comprising:
a substrate; and
a back-end-of-line (BEOL) layer on top of the substrate; wherein:
the BEOL comprises an octagonal metal fill region having an octagonal cross-sectional shape that is bounded on its sides by dielectric material.

Example 2 is the IC chip of Example 1, wherein the octagonal metal fill region comprises a same material.

Example 3 is the IC chip of Examples 1 and 2, wherein the BEOL layer comprises a plurality of octagonal metal fill regions having a pitch dimension below 30 nm.

Example 4 is the IC chip of Examples 1 through 3, wherein:
a lower sidewall of the octagonal metal fill region has an angle between 120° and 150° with a horizontal planar layer of the IC chip;
an upper sidewall of the octagonal metal fill region has an angle between 30° and 60° with a horizontal planar layer of the IC chip; and
a middle sidewall of the octagonal metal fill region has an angle of 90° with a horizontal planar layer of the IC chip.

Example 5 is the IC chip of Examples 1 through 4, wherein a metal liner separates the metal fill region from the dielectric material.

Example 6 is the IC chip of Examples 1 though 5, wherein the metal liner comprises at least one material selected from the group consisting of TaN, WN, and MoN.

Example 7 is the IC chip of Examples 1 through 6, wherein:
the metal liner comprises:
a lower component separating a metal fill region lower portion from the dielectric material;
a middle component separating a metal fill region middle portion from the dielectric material; and
an upper component separating a metal fill region upper portion from the dielectric material; and
the lower component, the middle component, and the upper component comprise materials that are different from one another.

Example 8 is the IC chip of Examples 6 and 7, wherein the metal liner comprises at least two materials selected from the group consisting of TaN, WN, and MoN.

Example 9 is the IC chip of Examples 1 through 8, wherein the dielectric material is selected from the group consisting of an organic polymer low-k dielectric and an SiCO-based low-k dielectric.

Example 10 is the IC chip of Example 9, wherein the organic polymer low-k dielectric is parylene and the SiCO-based low-k dielectric is selected from the group consisting of SiCOH and SiCNOH.

Example 11 is the IC chip of Examples 1 through 10, wherein the metal fill region comprises a metal selected from the group consisting of Ru, Pt, W, Co, Mo, Ni, and Rh.

Example 12 is an IC chip comprising:
a substrate; and
a back-end-of-line (BEOL) layer on top of the substrate; wherein:
the BEOL comprises, in vertical cross section, a metal fill region surrounded by a dielectric material and comprising a middle section with a critical dimension that is wider horizontally than an upper and a lower section of the metal fill region.

Example 13 is the IC chip of Example 12, comprising:
a bottom layer, comprising:

the lower section of the metal fill region that is made from a metal selected from the group consisting of: Ru, Pt, W, Co, Mo, Ni, and Rh;

a dielectric material adjacent to two sides of the lower section of the metal fill region comprising an SiCO-based low-k dielectric material; and a metallic liner portion between the lower section of the metal fill region and the horizontally-adjacent dielectric material, the metallic liner portion comprising WN;

a middle layer, comprising:

the middle section of the metal fill region that is made from a metal selected from the group consisting of: Ru, Pt, W, Co, Mo, Ni, and Rh;

a dielectric material adjacent to two sides of the middle section of the metal fill region comprising parylene; and a metallic liner portion between the middle section of the metal fill region and the horizontally-adjacent dielectric material, the metallic liner portion comprising TaN; and an upper layer, comprising:

the upper section of the metal fill region that is made from a metal selected from the group consisting of: Ru, Pt, W, Co, Mo, Ni, and Rh;

a dielectric material adjacent to two sides of the upper section of the metal fill region comprising an SiCO-based low-k dielectric material; and a metallic liner portion between the upper section of the metal fill region and the horizontally-adjacent dielectric material, the metallic liner portion comprising MoN.

Example 14 is a method for forming a back-end-of-line (BEOL) layer on an IC chip surface, comprising:

providing a first layer on top of a substrate layer of the IC chip, the first layer comprising a bottom portion of a metallic fill region having a first width as seen in a vertical cross-section of the IC chip, wherein the bottom portion of the metallic fill region is located between portions of a bottom dielectric layer;

providing a second layer on top of the first layer, the second layer comprising a middle portion of the metallic fill region having a second width as seen in the vertical cross-section of the IC chip that is wider than the bottom portion of the metallic fill region, wherein the middle portion of the metallic fill region is located between portions of a middle dielectric layer; and providing a third layer on top of the second layer, the third layer comprising a top portion of the metallic fill region having a third width as seen in the vertical cross-section of the IC chip that is narrower than the middle portion of the metallic fill region, wherein the top portion of the metallic fill region is located between portions of a top dielectric layer.

Example 15 is the method of Example 14, wherein, in cross-section:

the bottom portion of the metallic fill region is formed as a first isosceles trapezoid comprising two parallel sides in a horizontal plane of layers of the IC chip, and a top side that is longer than a bottom side;

the middle portion of the metallic fill region is formed as a rectangle; and the top portion of the metallic fill region is formed as a second isosceles trapezoid comprising two parallel sides in a horizontal plane of layers of the IC chip, and a top side that is shorter than a bottom side.

Example 16 is the method of Examples 14 and 15, wherein:

the first layer is formed by:

providing a dielectric A layer above a substrate layer;

applying a first hardmask on a top surface of the dielectric A layer;

creating the first isosceles trapezoid by etching away portions of the dielectric A layer down to a top of the substrate creating a first etched region;

removing the first hardmask;

applying a first metal liner layer on top and side surfaces of the remaining dielectric A layer portions and exposed substrate region;

applying a first metal fill layer within and above the etched portions of the dielectric A layer on top of the first metal liner layer; and planing the IC chip to a level of a top surface of the dielectric A layer;

the second layer is formed by:

selectively depositing a dielectric B layer on top of the top layer of the dielectric A layer;

applying a second metal liner layer on top and side surfaces of the selectively deposited dielectric B layer portions and top portions of the first metal fill layer; and applying a second metal fill layer between and above the portions of the dielectric B layer and between portions of the second metal liner layer; and the third layer is formed by:

applying a second hardmask on a top surface of the second metal fill layer;

performing a tapered metal etching of the second metal fill layer down to a top surface of the dielectric B layer;

removing the second hardmask;

applying a third metal liner layer on a top layer of the dielectric B layer and exposed side and top surfaces of a third metal fill layer extending above the second metal fill layer;

removing a portion of the third metal liner layer that extends above a top surface of the third metal fill layer;

depositing a dielectric C layer on top of the top layer of the dielectric B layer, on the top surface of the third metal fill layer, and on sides of the third metal fill layer; and planing the IC chip to the top surface of the third metal fill layer.

Example 17 is the method of Examples 14 through 16, wherein:

the etching away of portions of the dielectric A layer is performed by an ion beam etching operation;

the applying of the first metal liner layer is performed using an atomic layer deposition (ALD) process;

the planing of the IC chip to a level of a top surface of the dielectric A layer is performed using a chemical mechanical planarization (CMP) operation;

the performing of the tapered metal etching of the second metal fill layer is performed using an ion beam etching operation;

the applying of the third metal liner layer is performed using an ALD operation; and the planing of the IC chip to the top surface of the third metal fill layer is performed using a CMP operation.

Example 18 is the method of Examples 14 through 17, wherein:

the dielectric A layer comprises an SiCO-based low-k dielectric;

the first metal liner layer comprises WN;

the first metal fill layer comprises a material selected from the group consisting of Ru, Pt, W, Co, Mo, Ni, and Rh;

the dielectric B layer comprises an organic polymer low-k dielectric;

the second metal liner layer comprises TaN;

the third metal liner layer comprises MoN; and the dielectric C layer comprises an SiCO-based low-k dielectric or an organic polymer low-k dielectric.

Example 19 is the method of Example 18, wherein:

the SiCO-based low-k dielectric is selected from the group consisting of an SiCOH-based low-k dielectric, and an SiCNOH-based low-k dielectric; and the organic polymer low-k dielectric is parylene.

Example 20 is the method of Example 18 and 19, wherein:

the bottom portion of the metallic fill region has sidewalls subtending an angle ranging between 120° and 150° with respect to a horizontal plane;

the middle portion of the metallic fill region has sidewalls subtending an angle of 90° with respect to the horizontal plane; and the top portion of the metallic fill region has sidewalls subtending an angle ranging between 30° and 60° with respect to the horizontal plane.

What is claimed is:

1. An integrated circuit (IC) chip comprising:

a substrate;

a back-end-of-line (BEOL) layer on top of the substrate, wherein the BEOL comprises an octagonal metal fill region having an octagonal cross-sectional shape that is bounded on its sides by dielectric material; and a metal liner separating the metal fill region from the dielectric material, wherein the metal liner comprises:

a lower component separating a metal fill region lower portion from the dielectric material;

a middle component separating a metal fill region middle portion from the dielectric material;

an upper component separating a metal fill region upper portion from the dielectric material; and the lower component, the middle component, and the upper component comprise materials that are different from one another.

2. The IC chip of claim 1, wherein the octagonal metal fill region comprises a same material.

3. The IC chip of claim 1, wherein the BEOL layer comprises a plurality of octagonal metal fill regions having a pitch dimension below 30 nm.

4. The IC chip of claim 1, wherein:

a lower sidewall of the octagonal metal fill region has an angle between 120° and 150° with a horizontal planar layer of the IC chip;

an upper sidewall of the octagonal metal fill region has an angle between 30° and 60° with a horizontal planar layer of the IC chip; and a middle sidewall of the octagonal metal fill region has an angle of 90° with a horizontal planar layer of the IC chip.

5. The IC chip of claim 1, wherein the metal liner comprises at least one material selected from the group consisting of TaN, WN, and MoN.

6. The IC chip of claim 1, wherein the metal liner comprises at least two materials selected from the group consisting of TaN, WN, and MoN.

7. The IC chip of claim 1, wherein the dielectric material is selected from the group consisting of an organic polymer low-k dielectric and an SiCO-based low-k dielectric.

8. The IC chip of claim 7, wherein the organic polymer low-k dielectric is parylene and the SiCO-based low-k dielectric is selected from the group consisting of SiCOH and SiCNOH.

9. The IC chip of claim 1, wherein the metal fill region comprises a metal selected from the group consisting of Ru, Pt, W, Co, Mo, Ni, and Rh.

10. An integrated circuit (IC) chip comprising:

a substrate; and a back-end-of-line (BEOL) layer on top of the substrate, wherein the BEOL comprises, in vertical cross section, a metal fill region surrounded by a dielectric material and comprising a middle section with a critical dimension that is wider horizontally than an upper section and a lower section of the metal fill region; and a metal liner separating the metal fill region from the dielectric material, wherein the metal liner comprises:

a lower component separating a metal fill region lower portion from the dielectric material;

a middle component separating a metal fill region middle portion from the dielectric material;

an upper component separating a metal fill region upper portion from the dielectric material; and the lower component, the middle component, and the upper component comprise materials that are different from one another.

11. The IC chip of claim 10, comprising:

a bottom layer, comprising:

the lower section of the metal fill region that is made from a metal selected from the group consisting of: Ru, Pt, W, Co, Mo, Ni, and Rh;

a dielectric material adjacent to two sides of the lower section of the metal fill region comprising an SiCO-based low-k dielectric material; and a metallic liner portion between the lower section of the metal fill region and the horizontally-adjacent dielectric material, the metallic liner portion comprising WN;

a middle layer, comprising:

the middle section of the metal fill region that is made from a metal selected from the group consisting of: Ru, Pt, W, Co, Mo, Ni, and Rh;

a dielectric material adjacent to two sides of the middle section of the metal fill region comprising parylene; and a metallic liner portion between the middle section of the metal fill region and the horizontally-adjacent dielectric material, the metallic liner portion comprising TaN; and an upper layer, comprising:

the upper section of the metal fill region that is made from a metal selected from the group consisting of: Ru, Pt, W, Co, Mo, Ni, and Rh;

a dielectric material adjacent to two sides of the upper section of the metal fill region comprising an SiCO-based low-k dielectric material; and a metallic liner portion between the upper section of the metal fill region and the horizontally-adjacent dielectric material, the metallic liner portion comprising MoN.

* * * * *